(12) United States Patent
Honda et al.

(10) Patent No.: US 11,029,673 B2
(45) Date of Patent: Jun. 8, 2021

(54) GENERATING ROBUST MACHINE LEARNING PREDICTIONS FOR SEMICONDUCTOR MANUFACTURING PROCESSES

(71) Applicant: PDF Solutions, Inc., Santa Clara, CA (US)

(72) Inventors: Tomonori Honda, Santa Clara, CA (US); Rohan D. Kekatpure, Sunnyvale, CA (US); Jeffrey Drue David, San Jose, CA (US)

(73) Assignee: PDF Solutions, Inc., Santa Clara, CA (US)

( * ) Notice: Subject to any disclaimer, the term of this patent is extended or adjusted under 35 U.S.C. 154(b) by 122 days.

(21) Appl. No.: 16/006,614

(22) Filed: Jun. 12, 2018

(65) Prior Publication Data

US 2018/0356807 A1    Dec. 13, 2018

Related U.S. Application Data

(60) Provisional application No. 62/518,807, filed on Jun. 13, 2017.

(51) Int. Cl.
| | | |
|---|---|---|
| G05B 19/418 | (2006.01) | |
| H01L 21/67 | (2006.01) | |
| G05B 13/02 | (2006.01) | |

(52) U.S. Cl.
CPC ... *G05B 19/41885* (2013.01); *G05B 13/0265* (2013.01); *H01L 21/67276* (2013.01); *G05B 2219/32338* (2013.01); *G05B 2219/33034* (2013.01); *G05B 2219/37436* (2013.01); *G05B 2219/42155* (2013.01); *G05B 2219/45031* (2013.01)

(58) Field of Classification Search
CPC ........ G05B 13/00; G05B 17/00; G05B 19/00; G05B 19/41885; G05B 13/0265; G05B 2219/32338; G05B 2219/33034; G05B 2219/37436; G05B 2219/42155; G05B 2219/45031; G06N 20/00; H01L 21/67276
USPC ..................................................... 700/121
See application file for complete search history.

(56) References Cited

U.S. PATENT DOCUMENTS

| | | |
|---|---|---|
| 3,751,647 A | 8/1973 | Maeder et al. |
| 5,793,650 A | 8/1998 | Mirza |
| 5,923,553 A | 7/1999 | Yi |
| 6,610,550 B1 | 8/2003 | Pasadyn et al. |

(Continued)

FOREIGN PATENT DOCUMENTS

CN          101738991 B          9/2014

OTHER PUBLICATIONS

U.S. Appl. No. 62/461,654 that supports earlier effective filing date of U.S. Patent Application Publication US 2018/0239851 A1 (Ypma). Feb. 21, 2017. (Year: 2017).*

(Continued)

*Primary Examiner* — Rocio Del Mar Perez-Velez
*Assistant Examiner* — Christopher W Carter
(74) *Attorney, Agent, or Firm* — Dergosits & Noah LLP

(57) ABSTRACT

Robust machine learning predictions. Temporal dependencies of process targets for different machine learning models can be captured and evaluated for the impact on process performance for target. The most robust of these different models is selected for deployment based on minimizing variance for the desired performance characteristic.

17 Claims, 9 Drawing Sheets

(56) References Cited

U.S. PATENT DOCUMENTS

| | | | |
|---|---|---|---|
| 6,751,519 B1 | 6/2004 | Satya | |
| 6,819,426 B2 | 11/2004 | Sezginer et al. | |
| 6,968,253 B2 | 11/2005 | Mack et al. | |
| 7,117,057 B1 | 10/2006 | Kuo et al. | |
| 7,184,853 B2 | 2/2007 | Roberts et al. | |
| 7,289,214 B1 | 10/2007 | Li et al. | |
| 7,403,832 B2 | 7/2008 | Schulze et al. | |
| 7,842,442 B2 | 11/2010 | Seltmann et al. | |
| 7,873,585 B2 | 1/2011 | Izikson | |
| 7,957,826 B2 | 6/2011 | Ausschinitt et al. | |
| 8,233,494 B2 | 7/2012 | Amini et al. | |
| 8,339,595 B2 | 12/2012 | Den Boef | |
| 9,002,498 B2 | 4/2015 | Chang | |
| 9,087,176 B1 | 7/2015 | Chang et al. | |
| 9,116,442 B2 | 8/2015 | Adel et al. | |
| 2003/0014145 A1 | 1/2003 | Reiss et al. | |
| 2003/0074639 A1 | 4/2003 | Park et al. | |
| 2003/0229410 A1 | 12/2003 | Smith et al. | |
| 2004/0167655 A1 | 8/2004 | Middlebrooks et al. | |
| 2004/0181728 A1 | 9/2004 | Pellegrini | |
| 2004/0233439 A1 | 11/2004 | Mieher | |
| 2005/0288812 A1* | 12/2005 | Cheng | G05B 19/41875 700/109 |
| 2008/0057418 A1 | 3/2008 | Seltmann | |
| 2008/0262769 A1 | 10/2008 | Kadosh et al. | |
| 2008/0275586 A1 | 11/2008 | Ko et al. | |
| 2010/0321654 A1 | 12/2010 | Den Boef | |
| 2013/0054186 A1 | 2/2013 | Den Boef | |
| 2013/0060354 A1 | 3/2013 | Choi et al. | |
| 2013/0110276 A1 | 5/2013 | Cheng et al. | |
| 2013/0208279 A1 | 8/2013 | Smith | |
| 2013/0230797 A1 | 9/2013 | Van Der Sanden | |
| 2013/0282340 A1 | 10/2013 | Liu et al. | |
| 2013/0310966 A1 | 11/2013 | MacNaughlon et al. | |
| 2013/0339919 A1* | 12/2013 | Baseman | G05B 19/41875 716/136 |
| 2014/0094015 A1 | 4/2014 | Kasa | |
| 2014/0362363 A1 | 12/2014 | Cai | |
| 2015/0253373 A1 | 9/2015 | Callegari et al. | |
| 2015/0369857 A1 | 12/2015 | Nakamura | |
| 2017/0109646 A1* | 4/2017 | David | H01L 22/12 |
| 2018/0239851 A1* | 8/2018 | Ypma | G06N 7/005 |

OTHER PUBLICATIONS

International Search Report and Written Opinion for PCT Application No. PCT/U92015//062693; dated Feb. 9, 2016.

Pilsung Kang et al., 'Virtual Metrology for Run-to-Run Control in Semiconductor Manufacturing', 2011, vol. 38, pp. 2508-2522, Elsevier, Expert Systems with Application.

William H. Arnold, Towards 3nm Overlay and Critical Dimension Uniformity: An Integrated Error Budget for Double Patterning Lithography, 2008, SPIE vol. 6924, Optical Microlithography XXI, pp. 1-9.

Prasad Dasari, Jie Li, Jiangtao Hu, Nigel Smith and Oleg Kritsun (2011). Diffraction Based Overlay Metrology for Double Patterning Technologies, Recent Advances in Nanofabrication Techniques and Applications, Prof. Bo Cui (Ed.), ISBN: 978-953-307-602-7, InTech, Available from: http://www.intechopen.com/books/recentadvances-in-nanofabrication-techniques-and-applications/diffraction-based-overlay-metrology-for-doublepatterning-technologies.

Peter M. O'Neili et al., 'Statistical Test: A New Paradigm to Improve Test Effectiveness & Efficiency', 2007, pp. 1-10, IEEE International Test Conference. ISBN: 1-4244-1128-9/07.

Ajay Khochel et al., 'A Tutorial on STDF Fail Datalog Standard', 2008, pp. 1-10, IEEE International Test Conference, ISBN: 1-4244-4203-0/08.

Raphael Robertazzi et al., 'New Tools and Methodology for Advanced Parametric and Defect Structure Test', 2010, pp. 1-10, IEEE International Test Conference, ISBN: 978-1-4244-7207-9/10.

Shane A. Lynn, 'Real-Time Virtual Metrology and Control of Etch Rate in an Industrial Plasma Chamber', pp. 1-6; Part of 2012 IEEE Multi-Conference on Systems and Control; Oct. 3-5, 2012. Dubrovnik, Croatia 2012 IEEE International Conference on Control Applications (CCA).

Rao Desineni et al., 'The Grand Pareto: A Methodology for Identifying and Quantifying Yield Detractors in Volume Semiconductor Manufacturing', May 2, 2007, pp. 87-100, vol. 20, IEEE Transactions on Semiconductor Manufacturing.

Pieter Kneilssen et al., Powerpoint Presentation titled 'Litho InSight, a novel approach towards on-product litho performance improvement'; 31 pages, APC Conference XXVI in Ann Arbor, Michigan.

John C. Robinson, Ph.D., 'Intelligent Feed-forward of Non-Litho Errors for 3D Patterning', 20 pages, Sep. 30, 2014, APC Conference XXVI in Ann Arbor, Michigan.

Michael Hackerott, 'Semiconductor Manufacturing and Engineering Data Analysis', 38 pages.

Prasad Dasari et al, 'A Comparison of Advanced Overlay Technologies', 9 pages, 2010, vol. 7638, Metrology, Inspection, and Process Control for Microlithography XXIV, ccc Code: 0277-786X/10, doi: 10.1117/12.848189.

Daewoong An et al., 'A Semiconductor Yields Prediction Using Stepwise Support Vector Machine', Nov. 17-20, 2009, Proceedings of 2009 IEEE International Symposium on Assembly and Manufacturing in Suwon Korea, 7 pages.

Sae-Rom Pak et al., 'Yield Prediction using Support Vectors Based Under-Sampling in Semiconductor Process', pp. 896-900, Dec. 20, 2012, International Scholarly and Scientific Research & Innovation vol. 6, World Academy of Science, Engineering and Technology.

\* cited by examiner

|  |  | (i) MSE for All Thickness | | | (ii) MSE for Thickness <= 400 A° | | |
| --- | --- | --- | --- | --- | --- | --- | --- |
|  |  | Model A | Model B | Model C | Model A | Model B | Model C |
| Nominal | | 26.1 | 35.7 | 52.5 | 14.3 | 55.0 | 8.3 |
| blueshift | 10% | 33.7 | 36.1 | 53.2 | 15.1 | 55.5 | 5.4 |
| | 1% | 52.8 | 37.0 | 58.2 | 19.0 | 55.7 | 6.7 |
| | 0.10% | 103.6 | 40.4 | 85.2 | 30.6 | 54.1 | 14.6 |
| lower underlying layer | 10% | 50.2 | 37.0 | 64.7 | 27.7 | 57.4 | 21.8 |
| | 1% | 39.0 | 40.1 | 61.3 | 26.1 | 61.7 | 13.7 |
| | 0.10% | 98.8 | 69.3 | 127.2 | 54.0 | 63.9 | 43.8 |
| higher underlying layer | 10% | 36.9 | 35.1 | 55.4 | 18.2 | 54.8 | 10.2 |
| | 1% | 29.9 | 35.3 | 52.4 | 16.2 | 58.0 | 4.9 |
| | 0.10% | 32.2 | 34.4 | 51.7 | 14.7 | 53.8 | 5.4 |
| larger underlying variance | 10% | 32.4 | 35.3 | 54.3 | 17.1 | 54.0 | 8.2 |
| | 1% | 38.4 | 36.7 | 58.4 | 19.7 | 57.6 | 12.7 |
| | 0.10% | 37.3 | 38.6 | 56.6 | 23.9 | 63.6 | 13.2 |

Fig. 13

GENERATING ROBUST MACHINE LEARNING PREDICTIONS FOR SEMICONDUCTOR MANUFACTURING PROCESSES

CROSS REFERENCE

This application claims priority from U.S. Provisional Patent Application No. 62/518,807 entitled Assessing Robustness of ML Prediction for Semiconductor Predictions, filed Jun. 13, 2017, incorporated herein by reference in its entirety.

TECHNICAL FIELD

This disclosure relates generally to semiconductor manufacturing processes, and more particularly, to methods for generating more robust predictions for targeted process variables.

BACKGROUND

The semiconductor manufacturing industry is known as a complex and demanding business, and it continues to evolve with major changes in device architectures and process technologies. Typically, the semiconductor industry has been characterized by sophisticated high-tech equipment, a high degree of factory automation, and ultra-clean manufacturing facilities that cost billions of dollars in capital investment and maintenance expense.

Recently, the application of machine learning ("ML") algorithms has become popular for use with semiconductor manufacturing processes. Generally, an ML model can be constructed for a specific process parameter by sampling relevant data in order to build one or more training sets of data to represent expected performance of the process with regard to that parameter. However, a key assumption is that the training sets are representative of the actual test data, i.e., process measurements for future production runs. That assumption is not always accurate.

For example, one of the difficulties associated with implementing effective ML models in semiconductor manufacturing is the inherent time dependency of sensor measurements, which may be caused by process change, sensor degradation, etc. This time-dependent drift in the actual measurements often results in a scenario where the training sets do not accurately represent the future state of actual measurements for relevant test samples. Although this time-dependent drift in measurement values creates difficulty, the problems associated with environmental variation have been addressed in other fields.

The application of a "robust" design method, developed by Genichi Taguchi and generally known as the Taguchi Method, focuses on providing insensitivity to noise variations in a manufacturing process. The Taguchi Method was first developed and demonstrated in the aerospace industry but has been popularized by the automobile industry. The main goal of the approach is to pick design parameters that are insensitive to known manufacturing and environmental variations. This results in a final product that is robust to environmental and manufacturing variation but is achieved through sacrificing nominal performance. For example, the braking distance for an automobile should be robust for conditions such as snow and rain, rather than being optimized for sunny conditions.

The application of a "robust" design method, developed by Genichi Taguchi and generally known as the Taguchi Method, focuses on providing insensitivity to noise variations in a manufacturing process. The Taguchi Method was first developed and demonstrated in the aerospace industry, but has been popularized by the automobile industry. The main goal of the approach is to pick design parameters that are insensitive to known manufacturing and environmental variations. This results in a final product that is robust to environmental and manufacturing variation, but is achieved through sacrificing nominal performance. For example, the braking distance for an automobile should be robust for conditions such as snow and rain, rather than being optimized for sunny conditions.

As the field of semiconductor processing continues to mature, the trend is shifting from optimizing for nominal performance to optimizing for robust performances. This robustness tries to capture the performance of the system under more realistic conditions rather than ideal conditions. For example, control theory has shifted from proportional-integral-derivative ("PID") control to more advanced optimal control. The concept of robust control has developed so that the control works under certain predefined uncertainties. These uncertainties capture both systematic bias caused during capturing of system dynamics (i.e., modeling error) as well as environmental variability.

As ML models continue to be used in actual production systems, it becomes important to assess and optimize for robustness of these models. The main drawback of ML models is that they assume the test set to be similar to the training set. However, this is not necessary a practical assumption in a manufacturing related application, where there are many possible causes for drift in sensor measurements, including sensor degradation over time, manufacturing process adjustments, seasonal trends, etc.

Therefore, it would be desirable to be able to predict the potential drift in the input in order to make sure that the ML model is producing "reasonable" predictions.

BRIEF DESCRIPTION OF THE DRAWINGS

FIG. 13 is a table summarizing the mean square errors for the different machine learning models under different scenarios.

DETAILED DESCRIPTION

1. Overview

In this disclosure, the concept of robustness is applied to improve the quality of machine learning ("ML") models. In semiconductor manufacturing, there is always some time-dependent shift in measurements from process sensors. Thus, it is critical for ML model accuracy that it be insensitive to these time-dependent shifts. This description provides a practical approach for generating robust ML models.

The main idea is to basically understand the temporal dependencies of the independent variables, which are most commonly sensor measurements and/or parametric test measurements for semiconductor manufacturing applications. These temporal dependencies can be modeled using known modeling techniques, such as linear regression, nonlinear regression, and time series regression. For example, ARIMA, Kalman Filter, Nonlinear Kalman Filter (also known as Extended Kalman Filter), Particle Filter, etc. By modeling the time dependencies, a set of values is captured that have a higher chance of showing up in future production runs.

However, even though a set of future values can be defined for the independent variables, the values for corresponding dependent variables are still not known. Given a particular application, however, reasonable ranges can be defined for the dependent variables, such as: (i) a reasonable range for deposit and etch rates; (ii) a reasonable range for wafer yield and chip yield, etc. The model can be validated to make sure that the future predictions give reasonable predictions with the set of probable input values.

2. Semiconductor Manufacturing Processes Generally

Figure 1:
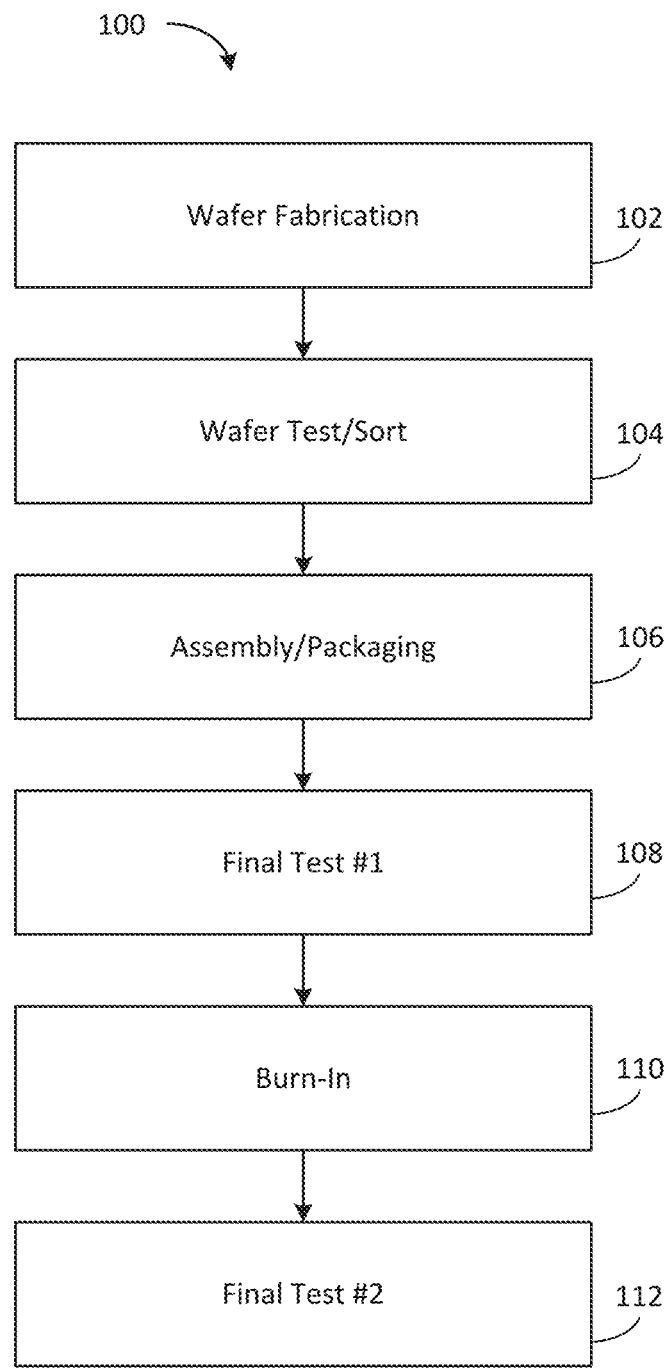
FIG. 1 is a flow chart illustrating a process for making a semiconductor device.

FIG. 1 is a simplified high level view a typical semiconductor manufacturing process 100, in which there may actually be hundreds of steps. In general, input data can be collected from the process at every step and sub-step of a production run, and yield and other performance characteristics may be calculated from the input data for each step as well as for the entire process predicted.

Wafer fabrication occurs in step 102, where a large number of integrated circuits are formed on a single slice of semiconductor substrate, such as silicon, known as a wafer. Many steps are required in various sequences to build different integrated circuits. For example, deposition is the process of growing an insulating layer on the wafer. Diffusion is the process of baking impurities into areas of the wafer to alter the electrical characteristics. Ion implantation is another process for infusing the silicon with dopants to alter the electrical characteristics. In between these steps, lithographic processing allows areas of wafer to be patterned with an image, then a mask is used to expose photoresist that has been applied across the wafer, and the exposed photoresist is developed. The pattern is then etched to remove selected portions of the developed photoresist, and these steps are repeated to create multiple layers. Finally, metallization is a specialized deposition process that forms electrical interconnections between various devices/circuits formed on the wafer. The fabrication process can take several months to complete before moving on to the post-fabrication steps.

Wafer test and sort occurs in step 104. After a wafer has been fabricated, all the individual integrated circuits that have been formed on the wafer are tested for functional defects, for example, by applying test patterns using a wafer probe. Circuits may either pass or fail the testing procedure, and failed circuits will be marked or otherwise identified, e.g., stored in a file that represents a wafer map.

Assembly and packaging takes place in step 106. The wafer is diced up into separate individual circuits or dies, and each die that passes through wafer sort and test is bonded to and electrically connected to a frame to form a package. Each die/package is then encapsulated to protect the circuit.

In step 108, the packages are subjected to random electrical testing to ensure that circuits in the package are still working as expected. In step 110, the remaining packages go through a burn-in cycle by exposing the package to extreme but possible operating conditions. Burn-in may involve electrical testing, thermal exposure, stress screening, or a combination of these, over a period of time. Burn-in testing reveals defective components. Finally, in step 112, a final round of electrical testing is conducted on the remaining packages.

3. Machine Learning Algorithms

Recent advances in computing technologies and data analysis techniques, such as performing parallel processing on a massive scale, has led to progress in machine learning algorithms, data mining, and predictive analytics. Machine learning ("ML") is a branch of artificial intelligence that involves the construction and study of systems that can learn from data. These types of algorithms, along with parallel processing capabilities, allow for much larger datasets to be processed, without the need to physically model the data. This opens up the possibility of incorporating data analysis to make adjustments to the process equipment, for example, on the lithographic apparatus for overlay error and critical dimension ("CD") variation. In addition to using the usual parameters to correct for overlay error (e.g., CD metrology, on-scanner data, wafer shape and geometry metrology, DBO measurement), process parameters and other metrology from upstream processes and metrology can also be used to train a machine learning algorithm that is focused on the overlay error.

Data has always played a role in semiconductor and electronics manufacturing. In the semiconductor industry, data was initially collected manually to track work-in-progress ("WIP"). The types of data collected included metrology data (measurements taken throughout the IC fabrication process), parametric test data, die test data, final test data, defect data, process data, and equipment data. Standard statistical and process control techniques were used to analyze and utilize the datasets to improve yields and manufacturing efficiencies. In many instances, the analysis was performed in a manual "ad-hoc" fashion by domain experts.

However, as device nodes became smaller and tolerances became tighter, factories became more automated and the ability to collect data improved. Even with this improvement in the ability to collect data, it has been estimated that no more than half of the data is ever processed. Further, of the data that is processed and stored, more than 90% of it is never again accessed.

Moving forward, data volume and velocity continues to increase rapidly. The recent norm for data collection rates on semiconductor process tools is 1 Hz. The International Technology Roadmap for Semiconductors (ITRS) predicts that the requirement for data collection rates will reach 100 Hz in three years. Most experts believe a more realistic rate will be 10 Hz. Even a 10 Hz rate represents a 10× increase in data rates. In addition to faster data rates, there are also more sensors being deployed in the semiconductor manufacturing process. For example, Applied Materials Factory Automation group has a roadmap that shows that advanced technology requirements are driving a 40% increase in sensors.

Given the massive amount of sensor data now collected, and the low retention rates of the data, advancements in data science could and should be implemented to solve the problems of the semiconductor industry. Some progress has been made to leverage data to improve efficiencies in the semiconductor and electronics industries. For example, microchip fabrication factories are combining and analyzing data to predict when a tool for a particular process needs maintenance, or to optimize throughput in the fab.

Figure 2:
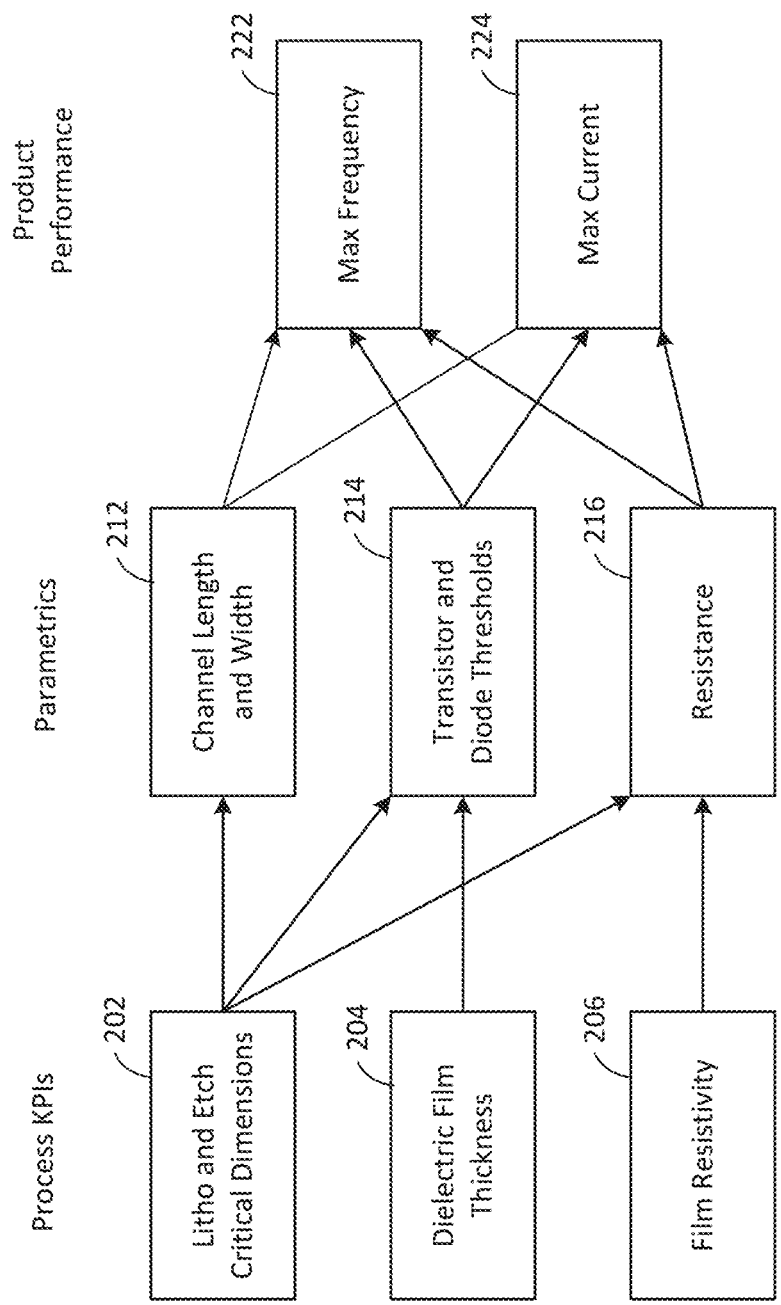
FIG. 2 is a block diagram illustrating relationships between different steps of the process of FIG. 1 and their cumulative effects on process variation and product performance.

Predictive analytics and ML algorithms can thus be used to address the challenges facing the semiconductor industry. By drilling deeper into the details of semiconductor manufacturing and knowing how to apply predictive analytics to detect and resolve process issues faster, and to tighten and target the specifications of individual manufacturing steps, increased process efficiencies can result. FIG. 2 shows an example of the cumulative effects of process variation on product performance. The relationships can be complex and difficult to correlate, e.g., key performance indicators (KPIs) of the process steps, such as the critical dimensions of lithographic and etch steps 202, the dielectric film thickness 204, and film resistivity 206; parametrics, such as channel length and width 212, transistor and diode thresholds 214, and resistance 216; and product performance, such as maximum frequency 222, and maximum current 224. We can use predictive analytics to quantify those relationships, and then leverage the relationships to predict and improve product performance.

In one example, virtual metrology can use machine learning algorithms to predict metrology metrics such as film thickness and critical dimensions (CD) without having to take actual measurements, in real-time. This can have a big impact on throughput and also lessen the need for expensive TEM or SEM cross-section measurements. Based on sensor data from production equipment and actual metrology values of sampled wafers to train the algorithm, virtual metrology can predict metrology values for all wafers. The algorithm can be a supervised learning algorithm, where a model can be trained using a set of input data and measured targets. The targets can be the critical dimensions that are to be controlled. The input data can be upstream metrology measurements, or data from process equipment (such as temperatures and run times).

In yet another example, the metrology measurements taken in-situ, or after a particular semiconductor process is complete, can be used as part of the input data for the virtual metrology system. For example, metrology data can be collected after a CMP step that occurred in one or more processing steps preceding the current process step. These metrology measurements can also be thickness data determined by each metrology system, or the refractive index and absorption coefficient.

In another example, metrology data can be collected during etch processes. Optical emissions spectra or spectral data from photoluminescence can be utilized as input data. Data transformation or feature engineering can be performed on in-situ spectral data or other sensor data that is collected during a particular process such as etch, deposition, or CMP. As an example, multiple spectra may be collected in-situ during processing. The spectral set used may be all spectra collected during processing, or a subset of spectra collected during processing. Statistics such as mean, standard deviation, min, and max may be collected at each wavelength interval of the spectral set over time and used as data inputs. As an alternative example, similar statistics can be collected for a given spectrum, and the time series of those statistics can be used as data inputs. As yet another example, peaks and valleys in the spectrum can be identified and used as data inputs (applying similar statistical transformation). The spectra may need to be normalized or filtered (e.g., lowpass filter) to reduce process or system noise. Examples of in-situ spectral data include reflectometry from the wafer, optical emissions spectra (OES), or photoluminescence.

In yet another example, machine learning algorithms can be used to control a manufacturing process step. As noted above, virtual metrology can be used to predict a critical dimension or film thickness for a manufacturing process step. Before or during processing of this manufacturing step, the prediction can then be used to set and/or control any number of processing parameters (e.g. run time) for that processing step. For example, in the case of CMP, if virtual metrology predicts that a dielectric film thickness will be 100 Angstroms thicker than the target thickness if the wafer was to be polished at the nominal polish time, then a calculation can be made to lengthen the polish time so that the final polished thickness can be closer to the target thickness.

Some of the foregoing techniques are further described in U.S. Publication No. 2016/0148850 entitled *Process Control Techniques for Semiconductor Manufacturing Processes* and in U.S. Publication No. 2017/0109646 entitled *Process Control Techniques for Semiconductor Manufacturing Processes*, both of which are incorporated herein in their entirety.

4. Robust Machine Learning

Figure 3:
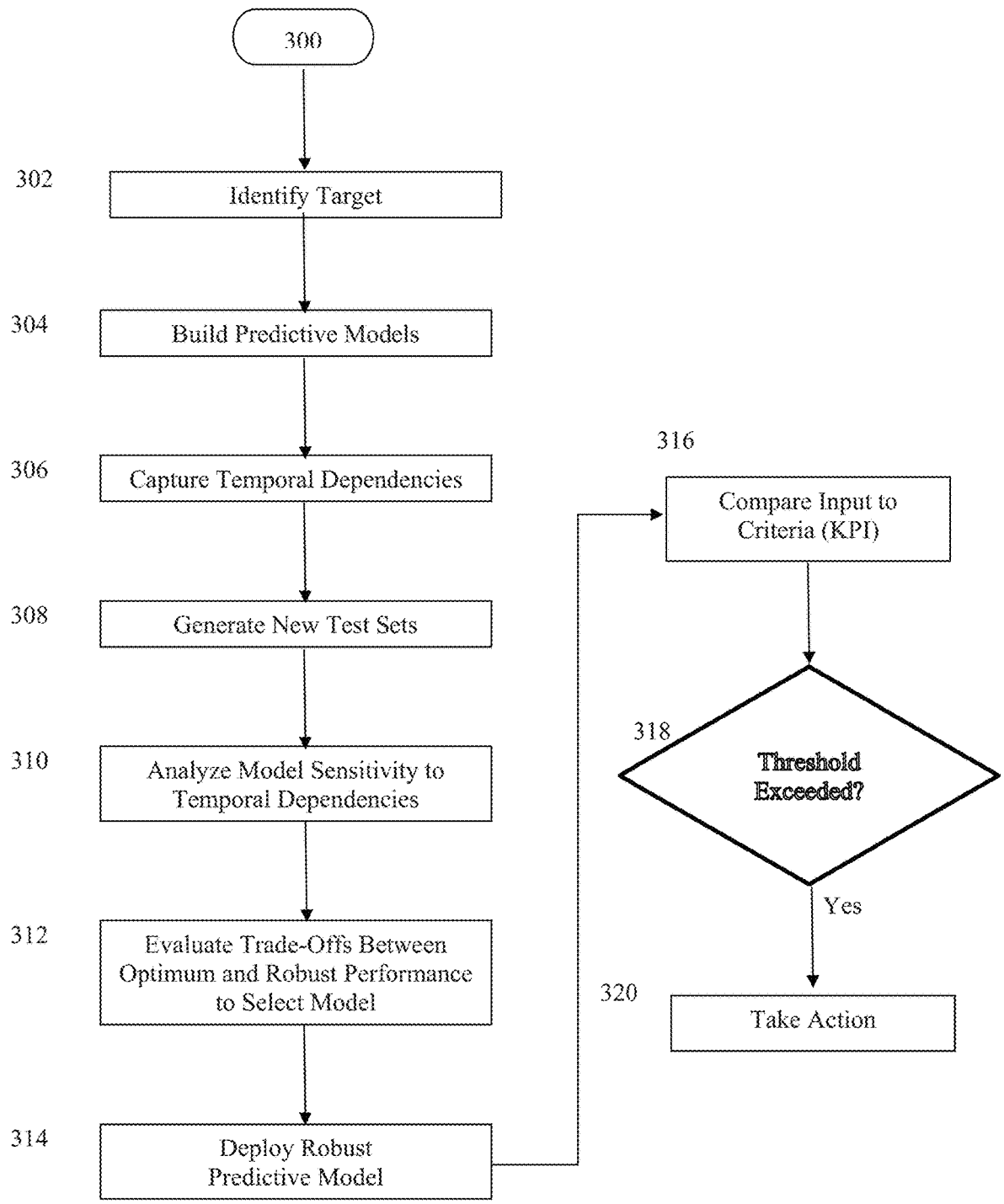
FIG. 3 is a flow chart illustrating a method for generating a machine learning model that incorporates temporal dependencies.

Referring now to FIG. 3, a general method 300 for building a robust production-worthy ML model that is focused on one or more targets of the semiconductor manufacturing process is illustrated. In step 302, the targets of interest for this particular ML model are identified. The targets include independent variables, for example, variables relating to specific features of the semiconductor device and which are used to characterize the ML model.

In step 304, a plurality of ML models are used to predict the target(s) using the current training set data. The ML models could include any model considered and/or used for deployment in actual production runs, but can also include new models created for this purpose. A variety of different types of models, i.e., statistical approaches to the data that utilize different algorithms and/or theories, can be employed on the basis that an evaluation of all the different predictions of the various different models may provide a better overall prediction; for example, by averaging all the different results, a more "robust" prediction target will result.

In step 306, the temporal dependencies of the independent variables are captured and identified. For example, the drift and/or variance of the relevant inputs can be modeled and evaluated in terms of statistical measures, frequency and other relevant characteristics of the input data, and regression analysis and other known filtering and analytical tools many be employed to evaluate the input variances.

In step 308, new test sets are created with the existing data to incorporate the temporal dependencies identified in step 306 above. In step 310, the various ML models are run again with the new test set(s), and the sensitivity of the various models to the temporal dependencies is analyzed.

In step 312, one of the models is chosen by evaluating any trade-offs between achieving an "optimum" performance characteristic and a "robust" performance characteristic for the target feature, and in step 314, the chosen model is deployed into production process to help manage the operation, maintenance, repair, and replacement of the process equipment. For example, in step 316, the selected input can be compared to a predefined criteria or key performance indicator ("KPI"), such as a specific threshold value for that input. If the selected input exceeds the criteria, for example, by exceeding the specific threshold value in step 318, then appropriate action is taken in step 320, such as repairing or replacing a sensor or other process equipment. Statistical measures of the selected input can be used, such as the variance, mean or median values. Application of the method 300 will be further described in the virtual metrology example below.

5. Virtual Metrology Example

In one example of virtual metrology, the goal is to predict the thickness of the wafer top layer given spectrometry data. More specifically, an ML-based model can predict the top layer thickness as a function of a vector consisting of reflective intensity values measured at predefined wavelength values. The main difficulty associated with this prediction is the possibility of significant variances of the wafers and by the measuring equipment, as observed through the spectrometry, and in particular, in the signal to noise ratio of relevant input data.

Figure 4:
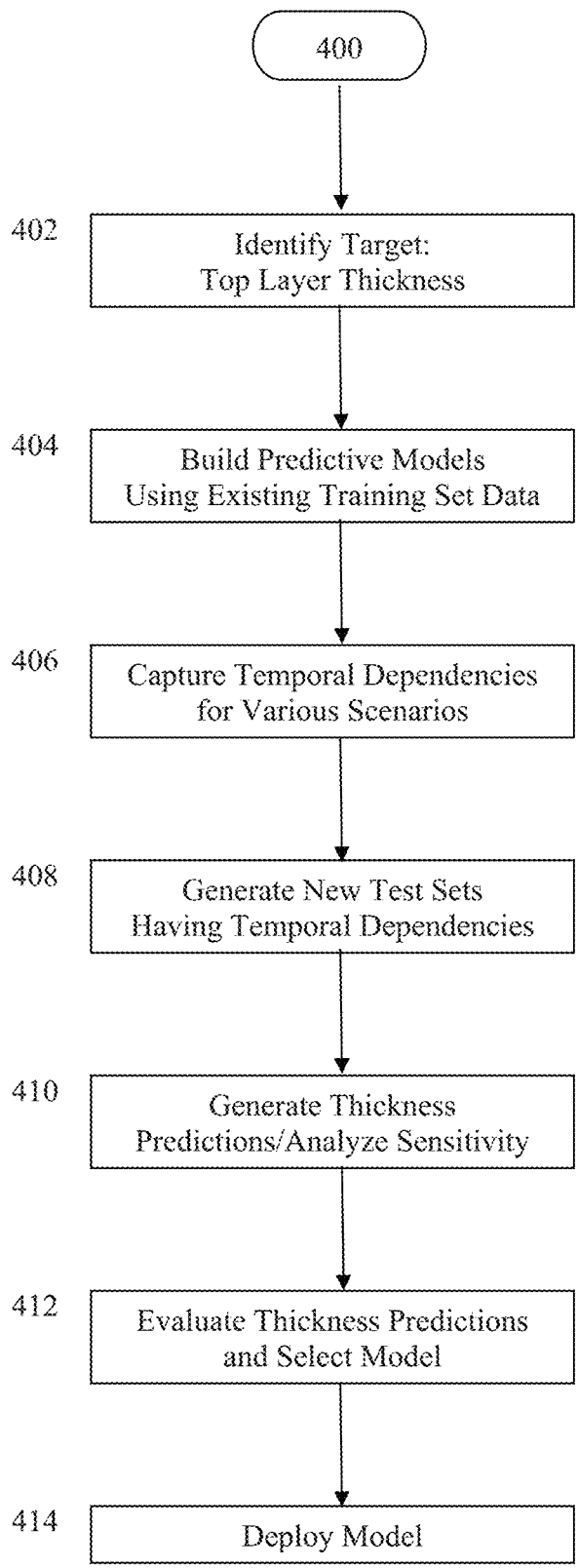
FIG. 4 is a flow chart illustrating a method for generating a machine learning model that incorporates temporal dependencies for the specific example of controlling top layer thickness.
Figure 5:
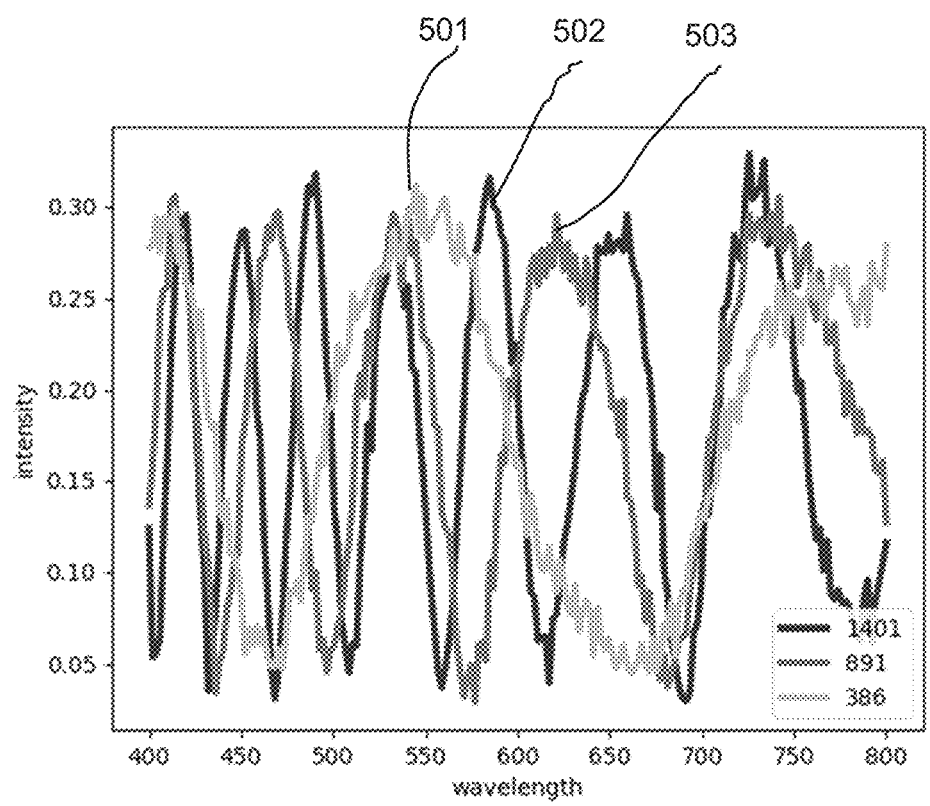
FIG. 5 is a graph plotting spectral intensity as a function of wavelength for three different layer thicknesses.

A process 400 for predicting top layer wafer thickness, consistent with method 300, is illustrated in FIG. 4. In step 402, the target for a predictive model is identified, in this case, the thickness of the wafer top layer. In step 404, predictive models are constructed as ML models and run using a training set of historical data relevant to the target and sampled from actual production runs. One example of relevant training set data is shown in FIG. 5, wherein graphical representations 501, 502, 503 are vectors showing measured intensity of optical radiation as a function of wavelength for each of three different measured layer thicknesses. That is, vector 501 represents a plot of signal intensity as a function of wavelength for a measured thickness of 386 nm; vector 502 represents a plot of intensity as a function of wavelength for a measured thickness of 1401 nm; and vector 503 represents a plot of intensity as a function of wavelength for a measured thickness of 891 nm.

There are many possible objectives for this modeling problem. A typical regression analysis focuses on minimizing the root-mean-square error ("RMSE") or the mean-absolute error ("MAE"). However, the semiconductor industry uses another measure called the wafer-to-wafer range ("WTWR"), which is defined as:

$$WTWR = \max(\vec{p}) - \min(\vec{p})$$

where $\vec{p}$ is a vector representing endpoint thickness prediction, and the wafer-to-wafer range is equal to the maximum positive difference minus the maximum negative difference. Additionally, since virtual metrology is designed to control processing of the wafer, it is critical to determine the thickness range for which the ML model should be optimized. The choice of these different objective functions may impact selection of final model.

Figure 6:
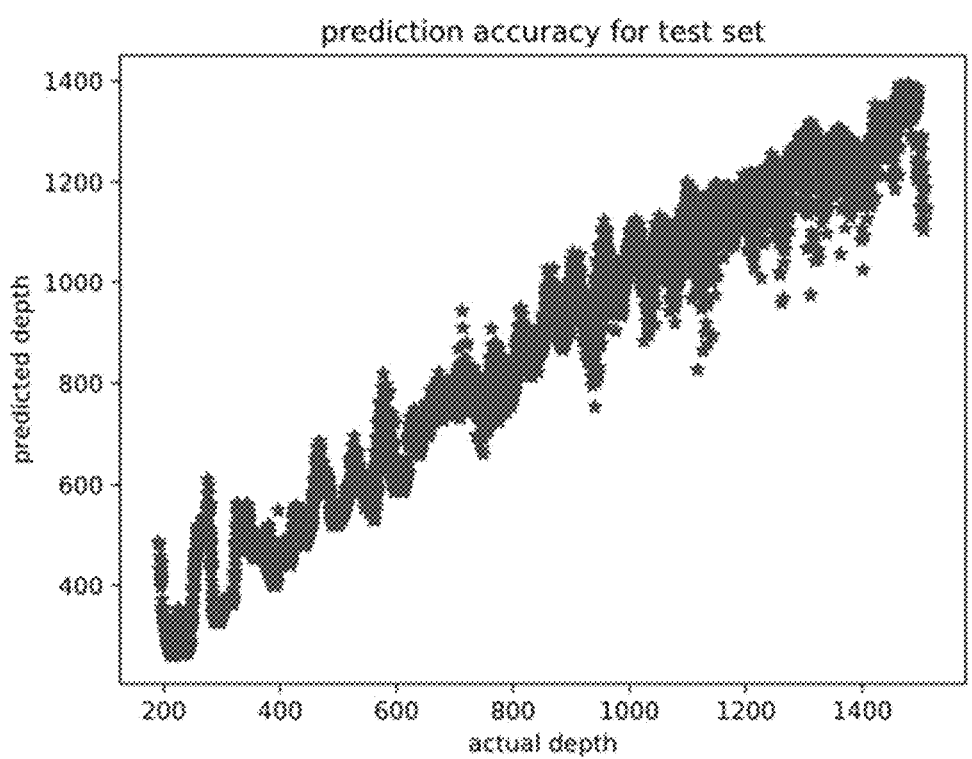
FIG. 6 is a graph plotting the actual layer thickness against the predicted layer thickness using machine learning Model A.
Figure 7:
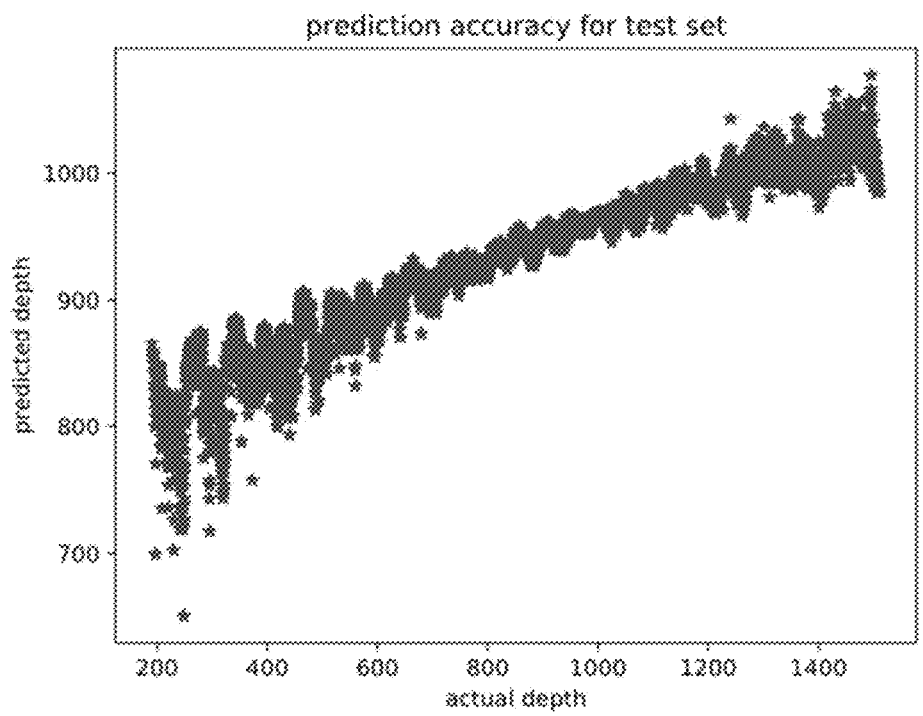
FIG. 7 is a graph plotting the actual layer thickness against the predicted layer thickness using machine learning Model B.
Figure 8:
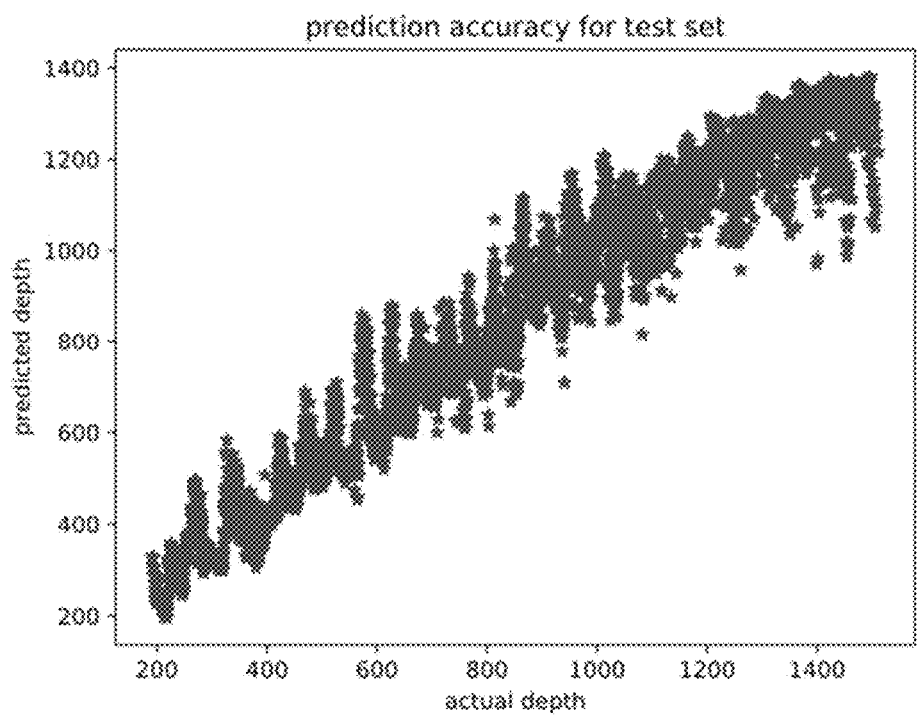
FIG. 8 is a graph plotting the actual layer thickness against the predicted layer thickness using machine learning Model C.

For this case study, two different objectives are considered: (i) the accuracy of a model to predict thickness over a wide range between 350 Å to 1500 Å; and (ii) the accuracy of a model to predict thickness over a narrow range between 350 Å to 400 Å. In order to evaluate these objectives, three different predictive models were used to predict wafer thicknesses while minimizing RMSE. The results are shown in FIGS. 6-8. For example, FIG. 6 is a plot of predicted depth versus actual measured depth for a first ML model (model A); FIG. 7 is a plot of predicted depth versus actual measured depth for a second ML model (model B); and FIG. 8 is a plot of predicted depth versus actual measured depth for a third ML model (model C).

As noted above, in this case the overall objective is to minimize Root Mean Square Error (RMSE) for all three models. There are many different types of ML models to select from, based on different statistical theories and constructs. For example, a model could be based on a linear regression algorithm such as ordinary least squares ("OLS"); a robust linear regression algorithm such as Huber, Random Sample Consensus (RANSAC), Elastic Net, Least Absolute Shrinkage and Selection Operator (LASSO), Ridge; an Artificial Neural Network (ANN) algorithm; a Support Vector regressor (SVR) algorithm; advanced boosting and bagging algorithms such as Random Subspace, Residual Modeling, Random Forest Model, Gradient Boosting Model; and the K-nearest neighbor algorithm, etc. Additionally, input variable for ML algorithm may be transformed first using unsupervised learning such as Principal Component Analysis (PCA), Singular Value Decomposition (SVD), Kernel PCA, Restricted Boltzman Machine (RBM), Auto-Encorder, etc.

Returning to FIG. 4, in step 406, the temporal dependencies for this case study are captured. These dependencies include both univariate and multivariate temporal changes. These dependencies not only shift in their mean values, but also could be shifting in their variances and frequencies as well. Basically, any significant variance that results in drift in the inputs to the ML algorithm should be captured, evaluated, and accounted for in the predictive models. Thus, univariate temporal dependencies can be considered for all derived features that will be used by ML algorithms in addition to the original variables.

To capture the temporal dependencies, known regression analysis techniques are used on the input data, including but not limited to linear regression, robust linear regression, elastic net, kernel ridge regression (KRR), support vector regression, Autoregressive Integrated Moving Average (ARIMA), Kalman Filter, Nonlinear Kalman Filter, and Particle Filter. Temporal dependencies for multivariate variables can be considered by looking at the drift in their correlation matrix over time as well as the change in output from dimensional reduction techniques like PCA, SVD, and Linear Discriminant Analysis (LDA). Finally, we can capture the temporal multivariate drift in the sensor data by looking at the frequency of anomaly in multivariate anomaly detection algorithms like local outlier factor, isolation forest scores, and DBSCAN outlier counts.

Figure 9:
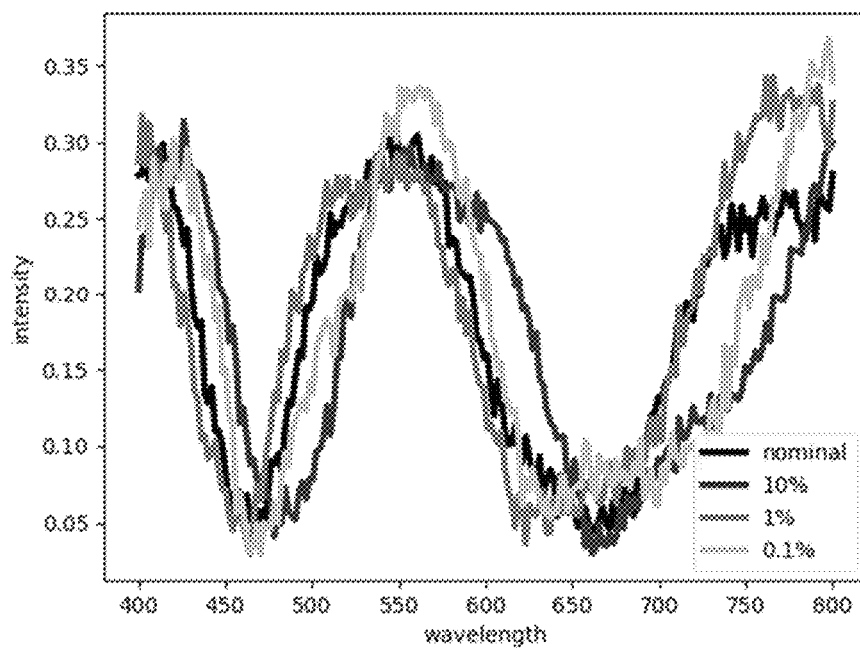
FIG. 9 is a graph plotting spectral intensity as a function of wavelength for different scenarios involving a lower underlayer thicknesses.
Figure 10:
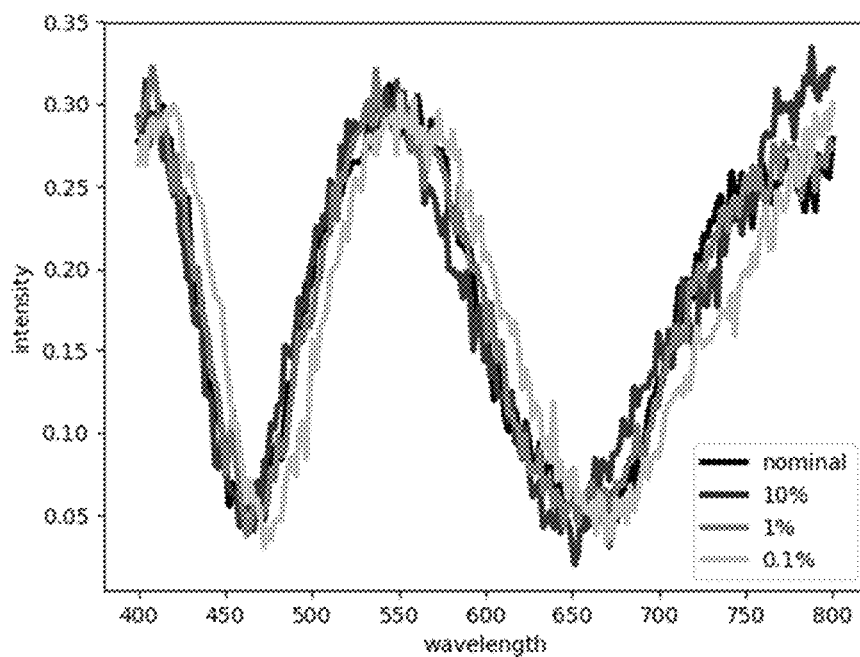
FIG. 10 is a graph plotting spectral intensity as a function of wavelength for different scenarios involving a higher underlayer thicknesses.
Figure 11:
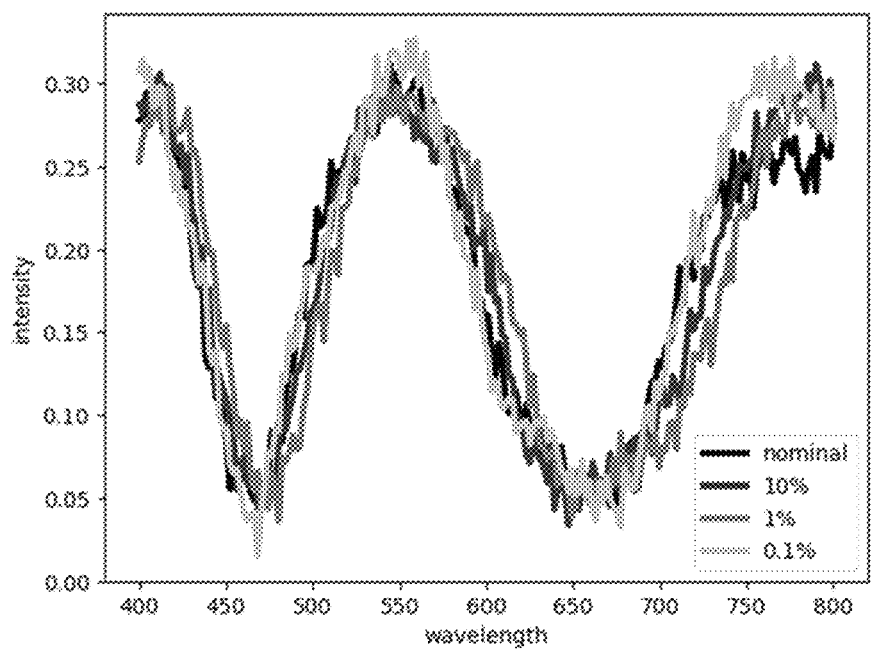
FIG. 11 is a graph plotting spectral intensity as a function of wavelength for different scenarios involving an increase in the variance of the underlayer thicknesses.
Figure 12:
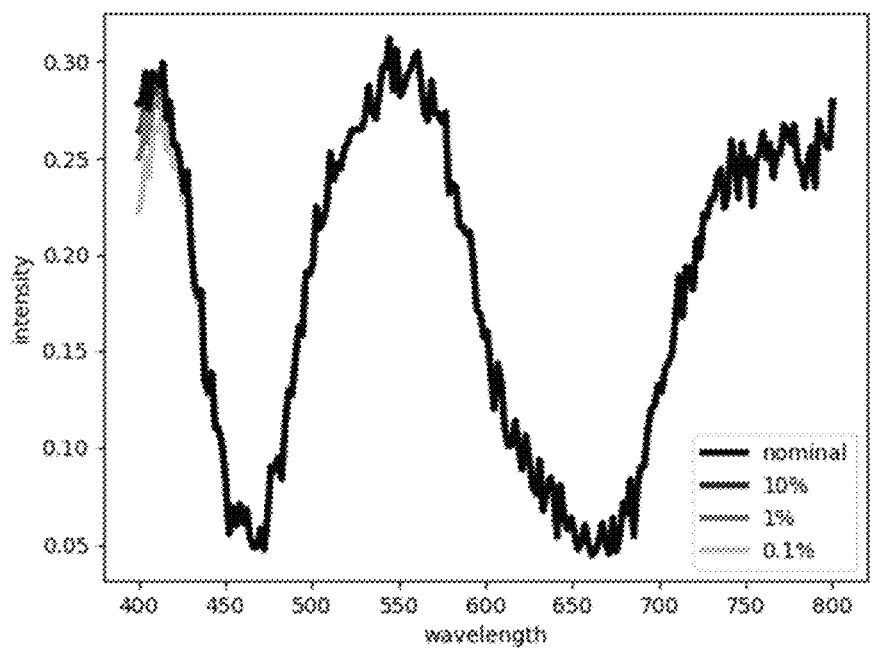
FIG. 12 is a graph plotting spectral intensity as a function of wavelength for different scenarios involving a blue shift.

Based on the historical data, the underlayer thickness could (i) become thinner over time (see FIG. 9); (ii) become thicker over time (see FIG. 10); or (iii) have increased variability over time (see FIG. 11). In addition, the "blue shift" can be measured, as seen in FIG. 12. The term "blue shift" refers to the intensity of blue light that is systematically reduced for all wafers due to the yellowing of lenses in optical sensors. The color of the lens actually becomes yellow over time, and this causes blue light to be absorbed at a greater rate. Thus, the temporal dependencies for these four scenarios will be explored.

Drift and the other variations in underlayer thickness can be determined using a physics-based model, also known as a white box model, by solving a multilayer optical calculation using the transfer-matrix method. The white box model simulates how light at different wavelengths propagates in planar multilayer thin films, considering transmission, reflection and absorption of light for the material properties and geometry. In general, the white-box model is a physics-based numerical method for finding solutions that satisfy these equations and may consist of performing a non-linear least-square ("NLLS") fit to the reflectometry (i.e. spectral) data in order to determine the physical parameters of interest, namely, different layer thicknesses. See <https://en.wikipedia.org/wiki/Transfer-matrix_method_(optics)>.

To examine the blue shift impact, historical data for different combinations of the underlying layer and the top layer is used to create a black box model that mimics the blue shift for the current dataset. The black-box model ignores the physics and directly models the relationship between the spectra and quantity of interest, namely, the endpoint thickness. Thus, the black-box model is used to (a) determine the optimal parametric model for representing a function that reduces intensity; and (b) create the probabilistic bounds on the amount of blue shift, given the historical data.

In step 408 of FIG. 4, new data sets that incorporate the temporal dependencies are generated from the ML models. The new data sets include an estimate for likelihood of change. For example, a reasonable estimate for underlayer thickness, where the original design thickness is 500 Å, could be: (i) lower than 450 Å for 10% of the time; (ii) lower than 400 Å for 1% of the time; or (iii) lower than 350 Å for 0.1% of the time. These estimates could be obtained using historical data, or from expert opinions. For example, the blue shift shown in FIG. 12 demonstrates that a reduced intensity is likely only for shorter wavelengths.

In step 410 of FIG. 4, thickness predictions are generated for each of the three models, based on the three different scenarios, as summarized in the table shown in FIG. 13. Thus, the results listed in FIG. 13 represent the Mean Square Errors (MSEs) of the predictions. and the corresponding RMSEs are obtained by taking the square root of the MSE values.

In step 412 of FIG. 13, the results shown in FIG. 13 are evaluated. The main objective of this exercise needs to be considered. If the goal is minimize the MSE near the desired top layer thickness of 500 Å, then Model C would be the obvious choice since the MSEs are the lowest. Further, the MSEs appear reasonably stable in Model C for the different possible drift scenarios. However, if the goal is to minimize MSE for the whole range up to 1500 Å, then Model C is clearly not the best choice since the MSEs are clearly no longer the lowest. For example, if the focus is on making sure that the process is robust to a 1% drift target, then Model B is a better choice and more robust to temporal changes than Model A since the MSEs appear more stable than Model A, namely, the range of MSE values under each scenario is not as great for Model B.

In addition to the systematic drift for input data that is described above, there may be random drift of input data caused by changes to the set of inputs that make up the training sets for the ML models. For example, semiconductor fabrication processes are constantly undergoing change, and this typically means that sensors and equipment are being repaired, replaced, added and/or removed. The relevant inputs to the training sets may disappear, or may be renamed, or recalibrated to have different characteristics, or new relevant inputs added. Accordingly, the training sets for ML models should be modified to account for all significant changes to relevant inputs, whether from systematic change such as temporal dependencies, or from random change such as added, removed, or changed inputs.

6. Conclusion

The foregoing written description is intended to enable one of ordinary skill to make and use the techniques described herein, but those of ordinary skill will understand that the description is not limiting and will also appreciate the existence of variations, combinations, and equivalents of the specific embodiments, methods, and examples described herein.

The invention claimed is:

1. A method for generating a robust predictive model for a semiconductor process, comprising:
    identifying a first plurality of inputs associated with at least one feature of interest in the semiconductor process;
    running each of a plurality of machine learning models using a first test set of input data including the first plurality of inputs, the plurality of machine learning models each configured with a different method for predicting a production result for the selected feature based on the first test set of input data;
    capturing a first set of temporal dependencies corresponding to the first plurality of inputs and analyzing any correspondence between the first set of temporal dependencies and one or more variances in the first plurality of inputs;
    creating at least one new test set of input data for the plurality of machine learning models, the new test set of input data incorporating the first set of temporal dependencies when a defined criteria for at least one of the first plurality of inputs exceeds a threshold; and
    deploying one or more of the plurality of machine learning models trained with the new test set of input data into a production environment.

2. The method of claim 1, the analyzing step further comprising:
    analyzing changes over time for any of the first plurality of inputs.

3. The method of claim 2, the analyzing step further comprising:
    analyzing changes over time for one or more statistical measures of any of the first plurality of inputs.

4. The method of claim 1, further comprising:
    modifying the one or more test sets to minimize the variance of a difference between the target and the predicted production result.

5. The method of claim 1, further comprising:
    modifying the one or more test sets to minimize the root mean square error of a difference between the target and the predicted production result.

6. A method for generating a robust predictive model for a semiconductor process, comprising:
    modeling a set of temporal dependencies for a first plurality of inputs relevant to a target in a first plurality of machine learning models, each of the first plurality of machine learning models configured differently to predict the target, each of the first plurality of machine learning models trained on one or more test sets of input data created by sampling the first plurality of inputs from the semiconductor process;

modifying the one or more test sets to minimize the temporal dependencies of the first plurality of inputs when there is a correspondence between the first set of temporal dependencies and one or more variances in the first plurality of inputs; and deploying one or more of the first plurality of machine learning models into a production environment.

7. The method of claim 6, the modeling step further comprising:

capturing one or more statistical measures of a difference between the target and the predicted target.

8. The method of claim 7, the capturing step further comprising:

identifying a drift in the mean of the difference between the target and the predicted target.

9. The method of claim 7, the capturing step further comprising:

identifying a spread in the range of the difference between the target and the predicted target.

10. The method of claim 6, further comprising:

analyzing any correspondence between the temporal dependencies of the first plurality of inputs and one or more changes in a difference between the target and the predicted target; and modifying the one or more test sets to incorporate the temporal dependencies when one of the changes exceeds a threshold.

11. A method for generating a robust predictive model for a semiconductor process, comprising:

predicting a production result for at least one target in a semiconductor process by running a plurality of machine learning models, each machine learning model configured differently, each machine learning model trained on one or more test sets of input data created by sampling a first plurality of inputs from the semiconductor process relevant to the target;

capturing a set of temporal dependencies for the first plurality of inputs, the temporal dependencies indicating one or more changes in the first plurality of inputs over time;

generating one or more new test sets of input data for training the plurality of machine learning models, the new test sets incorporating the temporal dependencies of the first plurality of inputs when a difference between the target and the predicted production result exceeds a threshold;

re-running each of the plurality of machine learning models using the new test sets of input data to obtain new predictions of the production result for the target;

evaluating the new predictions;

selecting one of the plurality of machine learning models to deploy in the semiconductor process based on minimizing a difference between the target and the predicted production result; and deploying the selected one of the plurality of machine learning models into a production environment.

12. The method of claim 11, further comprising:

modeling the set of temporal dependencies in order to incorporate the temporal dependencies into the new test sets.

13. The method of claim 12, wherein the temporal dependencies are modeled using analytical models including filtering or regression.

14. The method of claim 11, wherein the changes are indicated by one or more statistical measures of differences between the target and the predicted production result over time.

15. The method of claim 14, wherein the changes are minimized by selecting the one of the plurality of machine learning models that minimizes root mean square error of a difference between the target and the predicted production result.

16. The method of claim 11, wherein selecting one of the plurality of machine learning models is performed in accord with defined criteria for minimizing the changes in a difference between the target and the predicted production result.

17. A method for generating a robust predictive model for a semiconductor process, comprising:

identifying at least one independent variable used in the semiconductor process;

creating a plurality of predictive models for predicting a measure of the independent variable using existing input data;

capturing a set of temporal dependencies corresponding to the existing input data of the independent variable for each of the plurality of predictive models;

generating a plurality of new test sets for the plurality of predictive models when a defined criteria for the existing input data exceeds a threshold, the new test sets incorporating the temporal dependencies of the existing input data;

running each of the plurality of predictive models using the new test sets and analyzing how the temporal dependencies of the new test sets affect performance of the independent variable for each of the predictive models;

selecting a first one of the predictive models as exhibiting a robust performance characteristic; and deploying the selected first predictive model into a production environment.

* * * * *